United States Patent [19]
Das

[11] Patent Number: 5,498,850
[45] Date of Patent: Mar. 12, 1996

[54] SEMICONDUCTOR ELECTRICAL HEATER AND METHOD FOR MAKING SAME

[75] Inventor: Amitabh Das, Midlothian, Va.

[73] Assignee: Philip Morris Incorporated, New York, N.Y.

[21] Appl. No.: 73,539

[22] Filed: Jun. 8, 1993

Related U.S. Application Data

[63] Continuation-in-part of Ser. No. 943,505, Sep. 11, 1992.

[51] Int. Cl.$^6$ .............................. B23K 26/00; B23K 26/02
[52] U.S. Cl. .................................. 219/121.66; 219/121.64
[58] Field of Search ........................ 219/121.63, 121.64, 219/121.65, 121.66, 121.85

[56] References Cited

U.S. PATENT DOCUMENTS

| | | | |
|---|---|---|---|
| 3,402,460 | 5/1965 | Smith | 219/121 |
| 4,078,167 | 3/1978 | Banas et al. | 219/121 R |
| 4,261,764 | 4/1981 | Narayan | 148/1.5 |
| 4,281,236 | 7/1981 | von Allmen et al. | 219/121 LC |
| 4,321,283 | 3/1982 | Patel et al. | 427/74 |
| 4,513,298 | 4/1985 | Scheu | 346/140 |
| 4,947,020 | 8/1990 | Imamura et al. | 219/121.65 |
| 4,947,874 | 8/1990 | Brooks | 131/329 |
| 5,062,146 | 10/1991 | Kagechika | 392/432 |
| 5,093,894 | 3/1992 | Deevi et al. | 392/390 |

FOREIGN PATENT DOCUMENTS

| | | | |
|---|---|---|---|
| 3619342 | 12/1987 | Germany | 219/121.85 |
| 58-32593 | 2/1983 | Japan | 219/121.64 |
| 60-16876 | 1/1985 | Japan | 219/121.64 |

OTHER PUBLICATIONS

Hodgson, R. T., et al, "OHMIC Contacts Made By Lasers", IBM Technical Disclosure Bulletin, vol. 21, No. 10, Mar. 1979, p. 4286.
American Society for Metals, "Laser Beam Welding", *Metals Handbook*, Ninth Edition, 1983, vol. 6, pp. 647–671.
American Society for Metals, "Hardfacing—Laser Cladding", *Metals Handbook*, Ninth Edition, 1983, vol. 6, pp. 796–799.
Arthur B. Glaser and Gerald E. Subak–Sharpe, "Integrated Ciruit Engineering, Design, Fabrication and Applications," Publisher Addison–Wesley Publishing Company, ISBN No. 020107427–3, 1977.
Duvall, et al., "TLP* Bonding: a New Method for Joining Heat Resistant Alloys," *Welding Journal*, Apr., 1974, pp. 203–214.
Nakagawa et al., "Modeling of Base Metal Dissolution Behavior during Transient Liquid–Phase Brazing," *Metallurgical Transactions A*, Feb., 1991, vol. 22A, pp. 543–555.
Gale et al., "Microstructural Development in Transient Liquid–Phase Bonding," *Metallurgical Transactions A*, Oct., 1991, vol. 22A, pp. 2451–2457.
Hoppin et al., "Activated Diffusion Bonding," *Welding Research Supplement*, Nov., 1970, pp. 505–s through 509–s.
Popov et al., "Research Into The Structure Of The Transition Zone In Welding Joints Between Silicon Monocrystals And Tungsten," *Avt. Svarka*, 1974, No. 9, pp. 17–19.

(List continued on next page.)

*Primary Examiner*—Marvin M. Lateef
*Assistant Examiner*—J. Pelham
*Attorney, Agent, or Firm*—Charles E. B. Glenn; James E. Schardt; Kevin B. Osborne

[57] ABSTRACT

A method is disclosed for mechanically and electrically bonding metallic materials and semiconductor materials. The method according to the invention may be used, for example, in forming a semiconductor electrical heater, particularly for use in electrical smoking articles. A metallic element, such as a copper alloy power supply tab, is laser welded to a semiconductor element, such as a doped silicon resistive heater element. A laser beam is directed through a hole in the copper alloy tab to melt some silicon material, which flows into the hole in the copper tab, reacts and intermixes with the copper and solidifies to form a slug containing copper silicide. A protective material such as nickel may be applied to protect the copper silicide from oxidation if desired. An ohmic, low resistance contact and high strength bond is provided between the parts.

51 Claims, 5 Drawing Sheets

OTHER PUBLICATIONS

Mura'ev et al., "Effects of the Moisture Content Of The Shielding Atmosphere In Chambers On The Hydrogen Contents Of Welded Joints In Titanium Alloys," *Avt. Svarka,* 1974, No. 9, pp. 20–22.

Rudzit et al., "Selection Of A Non–Discrete Logic Model Of The Process Of The Thermocompression Welding Of Aluminum To Silicon," *Avt. Svarka,* 1975, No. 6, pp. 9–13.

Mechev et al., "The Axial Distribution Of Temperature Of An Electric ARC Burning In Argon," *Avt. Svarka,* 1975, No. 6, pp. 14–17.

Romanovskii et al., "On The Possibilities Of Increasing The Rate Of Formation Of Physical Contact Over A Large Area In The Solid–Phase Bonding Of Silicon To Aluminum," *Svar. Proiz.,* 1978, No. 7, pp. 4–5.

Romanovskii et al., "The Mechanical Properties Of Joints Between Single–Crystal Silicon And Aluminum Produced By Diffusion Bonding In Hydrogen," *Svar. Proiz.,* 1979, No. 5, pp. 31–32.

MacDonald, et al., "Transient Liquid Phase Bonding Processes," TMS Symposium The Metal Science of Joining, Cincinnati, 1991.

Mayer, "Gold Contacts to Semiconductor Devices," *Gold Bull.,* 1984, 17, (1), pp. 18–26.

5,498,850

SEMICONDUCTOR ELECTRICAL HEATER AND METHOD FOR MAKING SAME

CROSS REFERENCE TO RELATED APPLICATION

This application is a continuation-in-part of copending, commonly-assigned U.S. patent application Ser. No. 07/943,505, filed Sep. 11, 1992, which is hereby incorporated by reference in its entirety.

BACKGROUND OF THE INVENTION

This invention relates to a method for mechanically and electrically bonding a metal material to a semiconductor material, especially to provide a semiconductor electrical heater. More particularly, the invention relates to a method for laser-welding a metallic tab to a semiconductor heater element for use in electrical smoking articles.

It has been shown that semiconductor material, such as silicon doped with impurities, can be used to form resistive heating elements having a relatively large, preselectable, electrical resistivity. Such heating elements can be used in compact, lightweight heaters that can be repeatedly cycled from room temperature to temperatures in excess of 800° C. without substantial thermal degradation or changes in operating characteristics. Such a heater has been described, for example, in above-incorporated U.S. patent application Ser. No. 07/943,505. The heater described in application Ser. No. 07/943,505 can be used in an electrically heated smoking article, such as that described in commonly-assigned U.S. patent application Ser. No. 07/943,504, filed Sep. 11, 1992, which is incorporated herein by reference in its entirety.

As described in the above-incorporated commonly-assigned applications, electrical power is applied to each heater element through respective ohmic contacts. The ohmic contacts must have a low electrical resistance in order to concentrate the generation of heat in the bulk of the semiconductor material and thereby avoid excess power consumption and thermal degradation of the contact area. Furthermore, the contacts must be mechanically and chemically robust in order to withstand thermal stresses and oxidation caused by repeated heating cycles, and mechanical stresses caused during use by the mechanical contact of tobacco smoking material against the heating elements. Ideally, the contacts should be easy and inexpensive to make.

In order to apply power from a metallic conductor through the ohmic contacts, above-incorporated application Ser. No. 07/943,505 teaches (a) using mechanical clips that clamp against ohmic contact pads, (b) bonding metallic leads to ohmic contacts or (c) providing metallic "tabs" that make direct ohmic contact with the semiconductor heating element.

The present invention relates to an improved method for providing metallic "tabs" that make direct ohmic contact with a semiconductor element. The method can be used in forming a semiconductor electrical heater for use in an electrical smoking article.

SUMMARY OF THE INVENTION

In view of the above background, it is the aim of the invention to achieve the following objects singly or in combination:

to form a low-resistance ohmic contact directly between a metallic element and a semiconductor element;

to provide a mechanically and chemically robust bond between a metallic element and a semiconductor element that withstands mechanical stresses that can be caused by physical contact with the semiconductor element during use and that withstands repeated thermal stresses and oxidation that can be caused by repeated heating cycles of the semiconductor element;

to provide such a low-resistance, high-strength bond that is resistant to oxidation;

to provide a method for achieving such a bond that is not complicated, time-consuming or expensive; and to provide an electrical semiconductor heater that includes a semiconductor part and a metallic part bonded according to such a method.

The above objects are achieved according to the present invention, wherein metallic tabs are laser welded to a semiconductor material element. The method according to the invention can be used in forming various electrical articles that include a semiconductor element and a metallic element ohmically bonded to each other. For example, the method can be used in forming a semiconductor heater for use in an electrical smoking article.

Preferably, a copper-nickel alloy tab to be bonded to a doped silicon element has a via hole passing through it at the location of the intended bond. The metallic tab is brought into close proximity or contact with the silicon element, with the proper relative position between the two parts. Optionally, the metallic and silicon components may be preheated to reduce thermal stresses that subsequently arise. Then, a controlled laser beam, preferably a pulsed laser beam from a Nd:YAG laser, is directed through the via hole and onto the silicon.

The laser beam energy melts an amount of doped silicon at the bond site. The molten silicon rises into the via hole in the metallic element due to capillary, boiling or other action, whereupon the metallic alloy around the via hole begins to melt and the molten silicon reacts with the molten metallic alloy. As a result of surface tension, the molten, reacted material forms a substantially concave outer surface within the via hole and below the outer surface of the metallic tab.

After the controlled laser pulse has ended, the molten, reacted product of the doped silicon and the metallic alloy cools and solidifies to form a metal silicide within the via hole. The solidified metal silicide forms a mechanically sound joint and provides a direct ohmic contact between the metallic tab and the silicon element.

If it is further desired to protect the exposed surface of the metal silicide from oxidation, an oxidation-resistant metal, for example nickel, may be melted and solidified over the concave outer surface of the metal silicide. Advantageously, the oxidation-resistant metal intermixes and bonds with the metal silicide. Preferably, a controlled laser beam is used to melt the nickel in place.

The laser welded bond between the semiconductor and the metallic tab is sufficiently mechanically strong for use in many applications. While the bond is stronger in shear, it cannot withstand great tension between the parts because the interface between the semiconductor and the metal silicide is relatively brittle. Thus, in applications involving tension between the semiconductor and the metallic tab, a clip is applied according to the invention to hold the parts together and withstand the tension.

By carrying out the method according to the invention, metallic parts may be electrically and mechanically bonded to semiconductor parts to make various articles having unique electrical and mechanical properties according to the invention. The method according to the invention is especially adapted to making heaters comprising metallic power-supply tabs bonded to semiconductor heating elements.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

FIGS. 1–6 illustrate a first embodiment of the method of the present invention for forming a bond between a metallic tab and a semiconductor element. For example, a metallic power supply tab is bonded to a semiconductor element to provide an electrical heater.

Figure 1:
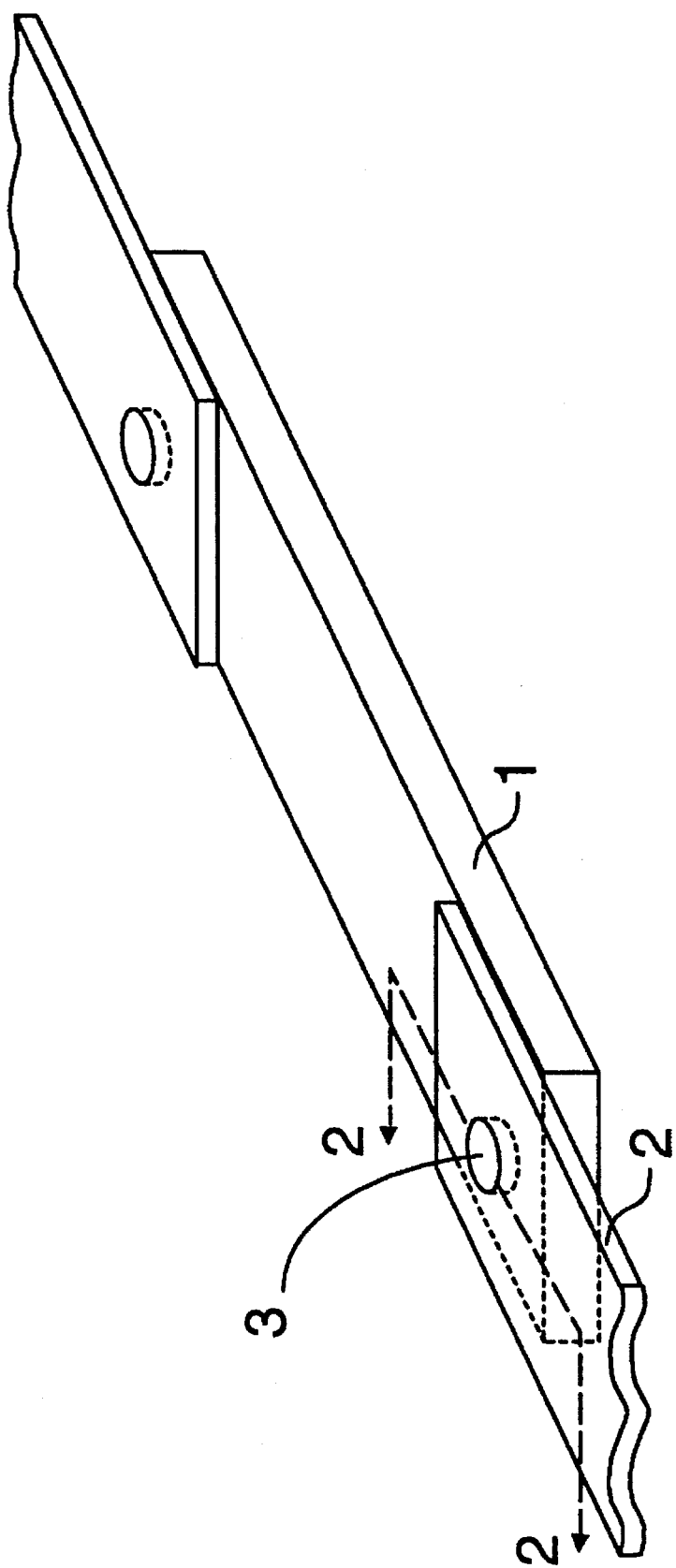
FIG. 1 is a perspective view of a semiconductor element and two metallic tabs, prior to bonding the parts according to a first embodiment of the method of the present invention to form a semiconductor heater.
Figure 2:
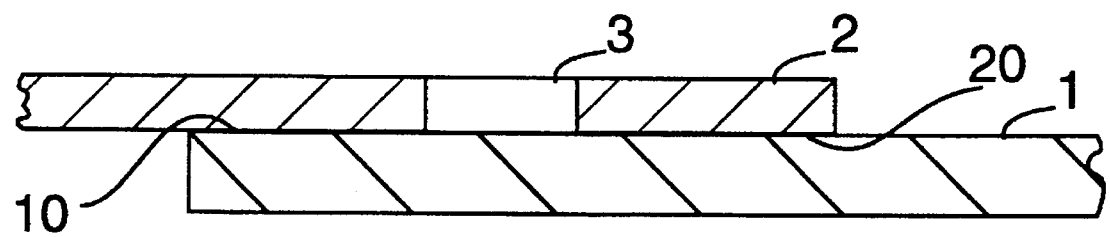
FIG. 2 is a fragmentary cross-sectional view taken along line 2—2 of FIG. 1, showing a metallic tab positioned against a semiconductor element, to be bonded according to a first embodiment of the method of the invention.

FIGS. 1 and 2 show a semiconductor element 1 in physical contact with metallic tab 2, which are to be mechanically and electrically bonded according to the first embodiment of the method of the present invention. Preferably, semiconductor element 1 is silicon doped with n- or p-type impurities to achieve a desired electrical resistivity to form a semiconductor heater element. Element 1 may be of any size suitable for its intended application. For example, in an electrical smoking article, semiconductor element 1 can be of a miniature size (e.g., about 10 mils to about 15 mils thick (i.e. about 0.25 mm to about 0.38 mm), about 1.5 mm wide and about 14 mm to about 16 mm long).

Metallic tab 2 is adapted to provide an ohmic contact to silicon element 1 while allowing for the convenient attachment of a power lead (not shown) to provide electrical current flow through semiconductor element 1. In accordance with the present invention, metallic tab 2 may have any alloy or pure metal composition that quickly and easily reacts with molten silicon to form a metal silicide, as will be discussed below. For example, among the silicide-formers copper, nickel and iron, copper is preferred for its relatively quick silicide formation reaction, low silicide formation temperature (about 850° C.), abundant availability and low cost. If semiconductor element 1 is phosphorous-doped silicon, for example, metallic tab 2 preferably comprises a copper alloy having a high proportion of copper, alloyed with a transition metal element that has good oxidation resistance (e.g., a 80Cu-20Ni or Cu—Cr—Ni alloy). Alternatively, it has been found that the metallic tab may comprise a copper-phosphor bronze alloy (e.g., comprising about 79.7% copper, 10% tin, 9.5% antimony and 0.8% phosphorous). If desired, metallic tab 2 can include as alloying elements one or more oxidation resistant metals such as nickel, chromium, titanium or molybdenum.

Metallic tab 2 preferably comprises a metallic foil, for example less than about 10 mils (i.e. about 0.25 mm) thick, more preferably about 3 mils to about mils (i.e. about 0.08 mm to about 0.20 mm) thick and most preferably about 6 mils to about 8 mils (i.e. about 0.15 mm to about 0.20 mm) thick. Furthermore, tab 2 is preferably about the width of the semiconductor element in the present embodiment but may have other dimensions as appropriate for its intended application. As shown in FIGS. 1 and 2, metallic tab 2 includes via hole 3 passing through its thickness. Via hole 3 is generally preformed by any known process such as drilling, punching, mask etching, etc. Alternatively, via hole 3 may be formed by a laser beam in a separate operation or in the same operation as the application of laser beam L for melting silicon as described below with reference to FIG. 3. Via hole 3 has a diameter of about 20 mils (i.e. about 0.5 mm) in the preferred embodiment, but can have any diameter that will allow the hole to be substantially filled by metal silicide upon melting of the silicon and reaction with the metal as will be discussed below.

In order to bond metallic tab 2 and semiconductor element 1 according to the method of the invention, first the two parts are suitably positioned and held relative to each other, to correspond approximately to the final intended arrangement of the parts. Tab 2 is positioned so that via hole 3 is at the intended bond location and so that contact surface 20 of tab 2 sufficiently overlaps contact surface 10 of element 1. For the embodiment shown in FIGS. 1 and 2, tab 2 overlaps or contacts element 1 on contact surfaces 10 and 20 having a contact area of from about 1 mm$^2$ to about 5 mm$^2$.

Preferably, metallic tab 2 is pressed against semiconductor element 1 so that the two parts are in intimate surface contact on the contact surfaces 10 and 20. If necessary, the contact surface 10, the contact surface 20 and/or the inner surface of the via hole 3 can be cleaned, for example by wet chemical etching or mechanical cleaning and polishing, to remove any significant oxides or contaminants before tab 2 and semiconductor element 1 are pressed together. It has generally been found that pressing a metallic foil tab against a semiconductor element causes the foil contact surface 20 to conform and partially adhere to semiconductor contact surface 10, whereby air gaps between the parts are substantially reduced.

However, because mechanical and electrical bonding is achieved in the via hole 3 as described below, it is not necessary to eliminate all gaps between tab 2 and semiconductor element 1. A small space or gap may remain between the parts, as long as it does not exceed the fitup limitations generally recognized in the welding arts, which would disrupt the bonding process associated with via hole 3 described below.

Once tab 2 and semiconductor element 1 have been aligned and held in proper position, an optional preheating step may be carried out. It has been found that preheating the semiconductor-metal system improves the final bond by reducing stresses that occur during the rapid solidification of molten material after the laser heating step described below. For example, the parts may be preheated by conduction from a conventional heating element placed in contact with at least one of the parts, while flowing argon or nitrogen or another inert gas over the interface area to reduce oxidation during the preheating step. The parts are preferably preheated to at least about 300° C. and most preferably up to about 600° C.

Figure 3:
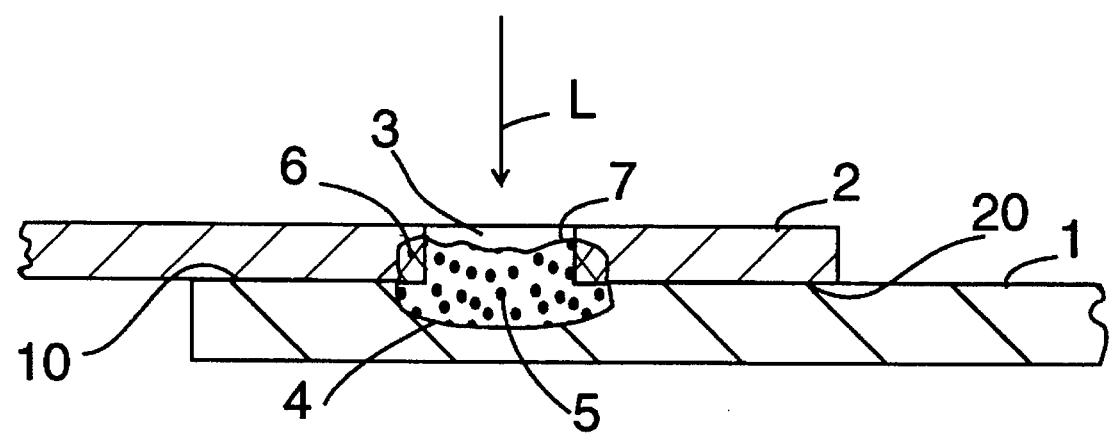
FIG. 3 is a sectional view similar to that of FIG. 2, but showing a subsequent stage in the method of the invention, wherein a laser beam has melted semiconductor material and the molten semiconductor material intermixes with the metallic material.

After the optional preheating step, the inventive method is further carried out by applying heating energy L to semiconductor element 1 through via hole 3, as shown in FIG. 3. Heating energy L is preferably a laser beam, most preferably a pulsed laser beam from a neodymium:yttrium-aluminum-garnet (Nd:YAG) laser. For example, a Nd:YAG laser beam having a pulse duration of about 5 msec, a spot diameter of about 0.5 mil (i.e. about 0.013 mm) and a dwell time adjusted to deliver about 8 joules of energy.

A laser beam is preferred as a heating energy source because it can rapidly provide a high energy density to a localized heating zone. The intensity and localization of the heating achieves low internal stress and distortion of the parts, fast cooling of the molten material and uniform solidification of a metal silicide formed from the intermixed metal and semiconductor product. Alternatively, any other controllable and localizable heating energy source, such as a microflame, may be used. In such cases it is preferable to carry out the heating under an inert gas atmosphere to avoid oxidation during longer heating times.

Any controllable gas or solid state laser may be used according to the invention. The selected laser may operate in a controlled continuous-wave manner or in a pulsed manner. However, a pulsed Nd:YAG laser is preferable to a continuous-wave $CO_2$ laser, for example, because it can be easier to control the YAG laser pulses to apply a controlled amount of energy to the thin materials to be bonded. Furthermore, it can be easier to focus a YAG laser than a $CO_2$ laser on the small geometries involved.

As shown in FIG. 3, when laser beam L is directed through via hole 3, the applied heating energy melts some doped silicon material 5 of semiconductor element 1 within an area bounded by interface 4. Interface 4 may have a bulb or inverted mushroom shape, because of the penetration of the laser beam L into the silicon and because of the conduction of heat into the silicon material. In order to penetrate into the silicon, the laser beam L possibly vaporizes some silicon material at the surface of semiconductor element 1 before melting silicon within the bulb-shaped penetration area.

The molten silicon 5 rises into via hole 3, possibly by capillary, boiling or other action. Because the molten silicon 5 is at a temperature above about 1400° C. (i.e. its approximate melting temperature), which is substantially higher than the melting temperature of copper alloy 2 (for example, about 1200° C.), the copper alloy in area 6 around the perimeter wall of via hole 3 begins to melt. Molten silicon 5 intermixes and reacts with the molten copper alloy 6, to form a metal silicide, substantially copper silicide. The intermixed silicon-metal product rises in via hole 3 and, because of surface tension, forms a rough, substantially concave surface 7 below the outer surface of metallic tab 2.

Laser beam L can be applied as described above to melt silicon 5 in a single pulse or in multiple pulses. Laser beam L can be directed to impinge upon the silicon while staying clear of the walls of via hole 3 or to partially impinge upon the copper alloy around via hole 3. Directing laser beam L partially at the copper alloy assures that copper alloy in area 6 will melt readily and react with molten silicon. Good control of the process and good results have been achieved by directing three or four sequential pulses of laser beam L at three or four locations around the perimeter of via hole 3.

Figure 4:
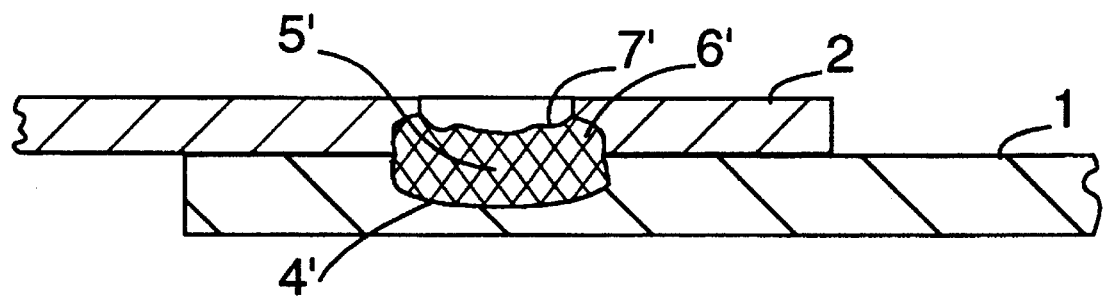
FIG. 4 is a sectional view similar to that of FIGS. 2 and 3, but showing a further subsequent stage, wherein the molten, intermixed material has solidified.

As shown in FIG. 4, after laser beam L has been switched off, the molten, intermixed silicon and metal has reacted, cooled and solidified to form slug 5' of silicon and metal silicide, e.g., copper silicide. Slug 5' is believed to comprise a complex, intermixed, reacted product that may include one or more of the following components: amorphous or semi-crystalline silicon (formed during rapid cooling after laser beam L is switched off), crystalline or semi-crystalline metal, metal silicide, and other components.

The bottom of slug 5' is defined by bulb-shaped interface 4' between slug 5' and the silicon material of element 1. Along this interface, some metal atoms, e.g., copper and nickel atoms that intermixed into slug 5' while it was in a molten state (5), have diffused and intermixed into the silicon surrounding slug 5'. The top of slug 5' in this embodiment has a substantially concave surface 7' within via hole 3 and preferably below the upper surface of metallic tab 2.

At this stage, as shown in FIG. 4, the metal silicide of slug 5' is exposed to the environment at concave surface 7'. Metal silicides, such as copper silicide in the present embodiment, are typically subject to rapid oxidation if exposed to atmospheric oxygen and moisture, even at room temperature. Oxidation and degradation are accelerated at the elevated temperatures occurring in smoking article heaters such as those described in above-incorporated U.S. patent application Ser. No. 07/943,505.

Oxidation of the copper silicide can cause two deleterious effects on the bond between metallic tab 2 and semiconductor element 1. First, oxidation may increase the electrical resistance of the copper silicide and impair the ohmic contact achieved by the bond. Second, oxidation may embrittle the silicide-copper interface and thereby may impair the mechanical strength of the bond. As described below and in accordance with the present invention, concave surface 7' can be sealed or otherwise protected from oxidation if desired.

Figure 5:
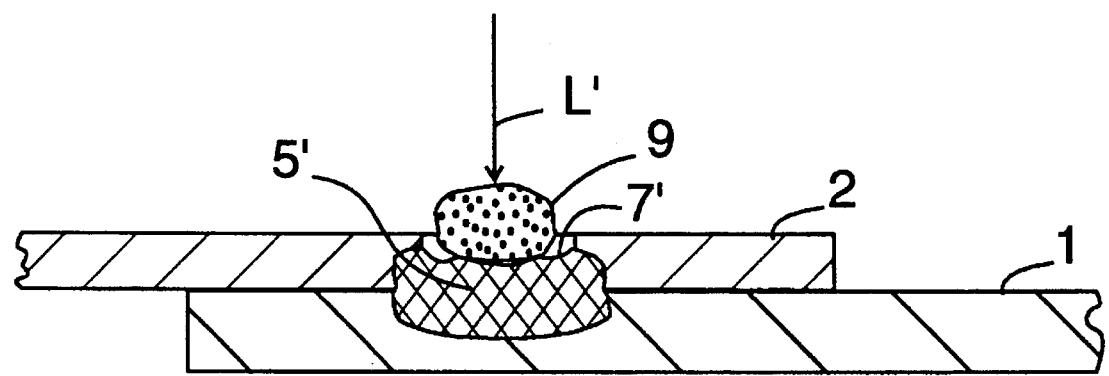
FIG. 5 is a sectional view similar to that of FIGS. 2–4, but showing a subsequent optional stage, wherein a laser beam impinges on an oxidation-resistant material that has been applied over the intermixed material.
Figure 6:
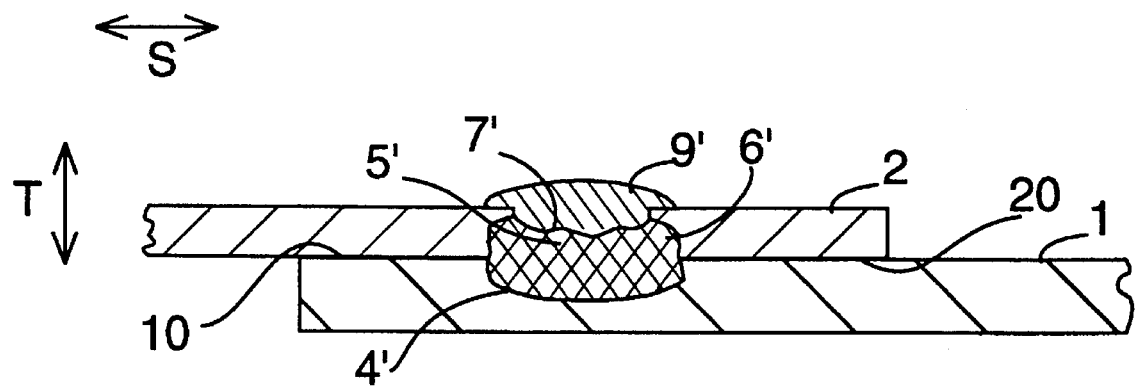
FIG. 6 is a sectional view similar to that of FIGS. 2–5, but showing a finished, bonded article according to the invention, wherein the optional oxidation-resistant material has solidified to form a protective seal.

As shown in FIGS. 5 and 6, optional protection against oxidation of the copper silicide can be provided by applying a protective layer or cap to the upper surface 7' of slug 5'. Further according to the invention, additional or secondary oxidation resistance may be provided by using a metal alloy in tab 2 that includes oxidation resistant metals as described above. These oxidation resistant alloy metals of tab 2 also may form metal silicides within slug 5' that are more resistant to oxidation than is copper silicide, for example.

FIG. 5 shows an oxidation resistant material 9 applied on surface 7' of slug 5'. Material 9 is preferably an oxidation resistant metal, such as nickel, that can be melted to form a cap over surface 7' and that bonds with surface 7'. The oxidation resistant material 9 can be applied in the form of a powder, bead, paste, piece of wire or some other form. A heat energy beam L' is applied to melt material 9. The energy beam L' may be a laser beam controlled as desired to an appropriate beam energy, spot diameter, pulse duration, dwell time, etc. Advantageously, laser beam L' may be produced by the same laser device that produces laser beam L described above, by simply readjusting beam parameters as desired.

Because nickel (material 9, for example) has a melting temperature of about 1450° C., and copper silicide has a melting temperature of about 850° C., when nickel 9 melts due to application of laser beam L', it is believed that the copper silicide (and copper and silicon) near surface 7' also partially melt. The nickel material 9 intermixes with the copper and silicon near surface 7', forms a protective nickel alloy coating and becomes well bonded to surface 7' of slug 5'. If desired, material 9 may be applied before slug 5' has cooled, to facilitate bonding of material 9 to surface 7'.

Preferably, the amount of material 9 is sufficient to at least cover surface 7' and partially fill the remaining space of via hole 3 upon melting. If desired, material 9 can fill via hole 3 at least flush with the surface of metallic tab 2. As shown in FIG. 6, after laser beam L' has been switched off and material 9 has melted and resolidified to form protective cap 9', the surface of cap 9' can have a slightly rounded head protruding above the surface of metallic tab 2. Alternatively, cap 9' can have a nearly flush surface like cap 9" shown in FIG. 8 and described below. Protective cap 9' seals surface 7' from the environment and reduces oxidation of the metal silicides of slug 5' because it is relatively oxidation resistant, especially after forming a layer of nickel oxide or other oxide that resists further oxidation.

Thus, FIGS. 1–6 illustrate a first embodiment of the method of the present invention for forming a bond between a metallic tab and a semiconductor element to provide an electrical heater. If desired, the bond can include a protective layer or cap for protection against oxidation.

Figure 7:
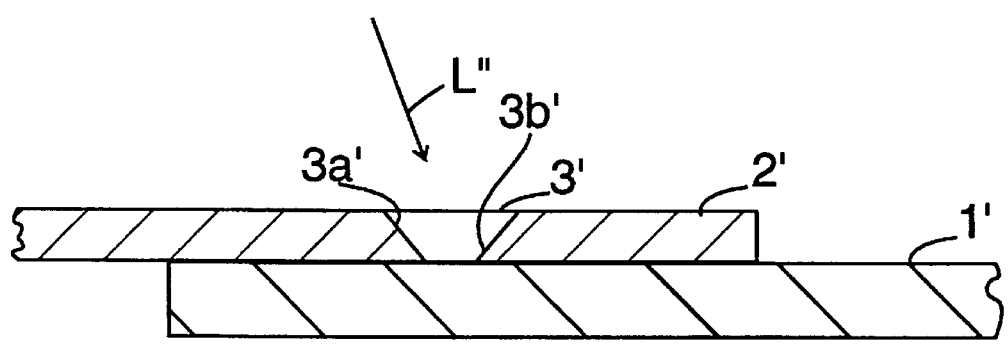
FIG. 7 is a fragmentary sectional view of a metallic tab positioned against a semiconductor element, to be bonded according to a second embodiment of the present invention.
Figure 8:
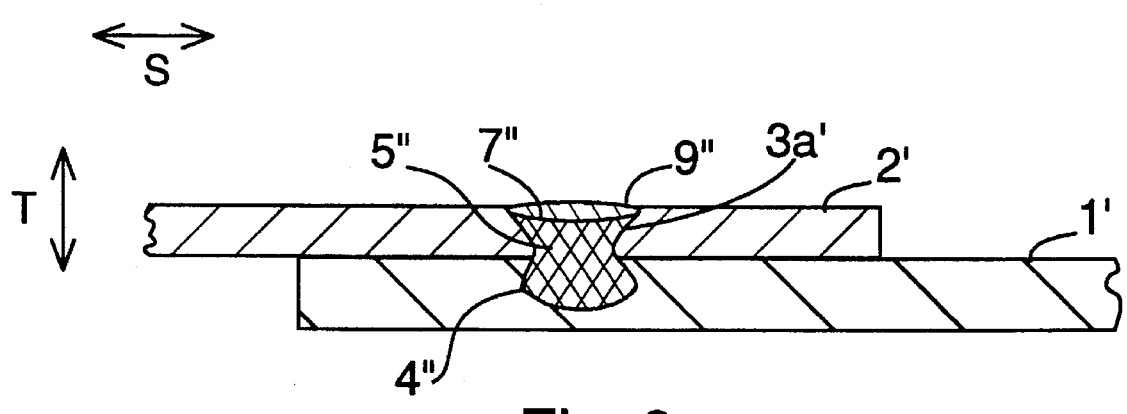
FIG. 8 is a sectional view similar to that of FIG. 6, but showing a finished, bonded article comprising the parts shown in FIG. 7.

FIGS. 7 and 8 illustrate a further embodiment of the method of the present invention. As shown in FIG. 7, via hole 3' in metallic tab 2' may have a slightly conical shape, with sloped sidewalls 3a'. Metallic tab 2' and semiconductor element 1' are arranged substantially as described above with reference to FIGS. 1 and 2. When laser beam L" is applied substantially as described above with reference to FIG. 3, laser beam L" impinges on lower portions 3b' of sloped sidewalls 3a'. Lower portions 3b', comprising the metallic material of tab 2', are melted by laser beam L", which then also melts silicon material of element 1', substantially as shown and described with reference to FIG. 3.

If desired for either via hole 3 or 3', laser beam L" may be applied at an angle as shown in FIG. 7, rather than substantially perpendicularly to the surface of semiconductor element 1 as shown for laser beam L in FIG. 3. Such an angled application of laser beam L" may aid in forming a bulb-shaped silicon melt-zone defined by interface 4" in FIG. 8. Alternatively, the laser beam shown and described here with reference to FIG. 7 may be directed perpendicularly like laser beam L shown in FIG. 3.

As shown in FIG. 8, after laser beam L" is switched off, the molten silicon and metal intermix, react, cool and solidify to form slug 5" comprising silicon, metal and metal silicides as described for slug 5' above with reference to FIG. 4. Slug 5" is bounded essentially by a bulb-shaped interface 4" between slug 5" and the semiconductor element 1', a top concave surface 7" within via hole 3' and conical-shaped sidewalls defined by sloped walls 3a' of via hole 3'.

As also shown in FIG. 8, an oxidation resistant protective cap 9" has been formed in a manner similar to cap 9' described above with reference to FIGS. 5 and 6. Protective cap 9" shown here is nearly flush with the surface of metallic tab 2', with only a slightly rounded top surface protruding from metallic tab 2'.

Thus, FIGS. 7 and 8 illustrate a second embodiment of the method of the present invention for forming a bond between a metallic tab and a semiconductor element, especially to provide an electrical heater.

The invention as described above in FIGS. 1–8 provides a good mechanical bond and an ohmic, low resistance contact between a semiconductor element and a metallic tab, to which a power lead may then be conveniently attached. Referring to FIG. 6, for example, a path of low electrical resistance is provided from metallic tab 2, through the transition area interface 6' between metallic tab 2 and slug 5', through slug 5', through interface 4' between slug 5' and semiconductor element 1, and finally into semiconductor element 1. At each interface 4' and 6', there is respective diffusion and intermixing of elements, so that a good electrical and mechanical bond occurs at the interfaces. Another path of electrical conduction is through contact surfaces 10 and 20 of element 1 and tab 2, respectively. The low resistance, ohmic contact achieved according to the invention has been found to be quite robust and stable. Tests have shown that a heater comprising a semiconductor element and a metallic tab bonded according to the invention can be subjected to over 1000 heating/cooling cycles (achieving surface temperatures in excess of 800° C.) with little degradation of the electrical characteristics of the ohmic contact.

The bond formed according to the method of the invention is mechanically strong in direction S (FIGS. 6 and 8), i.e., when shear is applied to slug 5' or 5", e.g., when element 1, 1" is pulled to the right and tab 2, 2" is pulled to the left. It should be understood that a similar shear may arise in the direction perpendicular to the plane of the drawings of FIGS. 6 and 8. Mechanical pull tests have shown that the silicon semiconductor element breaks before the welded bond according to the invention would break.

However, interface 4', 4" between the semiconductor and metal silicide slug 5', 5" may be relatively brittle. Thus, the welded bond is generally not as strong in direction T in comparison to direction S (FIGS. 6 and 8), i.e., when tension is applied to slug 5', 5". Thus, when tab 2, 2' and element 1, 1' are subjected to forces pulling them apart in direction T, the slug 5', 5" may tend to pull out of the element 1, 1' along the interface 4', 4" or possibly along the interface 6', 3a'. The strength of the bond in direction T is improved in the embodiment of FIG. 8 compared to that of FIG. 6, in that the bulb shape of interface 4", i.e., of the portion of slug 5" extending into semiconductor element 1', more securely anchors slug 5" in element 1'. Similarly, the conical shape of the upper portion of slug 5", defined by sloped walls 3a' of via hole 3', more securely anchors slug 5" in the tab 2'.

Thus, the method of the present invention provides a bond between a semiconductor element and a metallic tab that has low, ohmic electrical resistance, high mechanical strength and little degradation of these properties after repeated thermal cycling. It is further advantageous that the method of the invention can be carried out in relatively few steps and in a short total time, for example, within a few seconds or less. It has been observed that the above described application of laser beam heating, melting of silicon material, and intermixing, reaction and solidification of a metal silicide product can be carried out within about 20 milliseconds to about 50 milliseconds.

Figure 9:
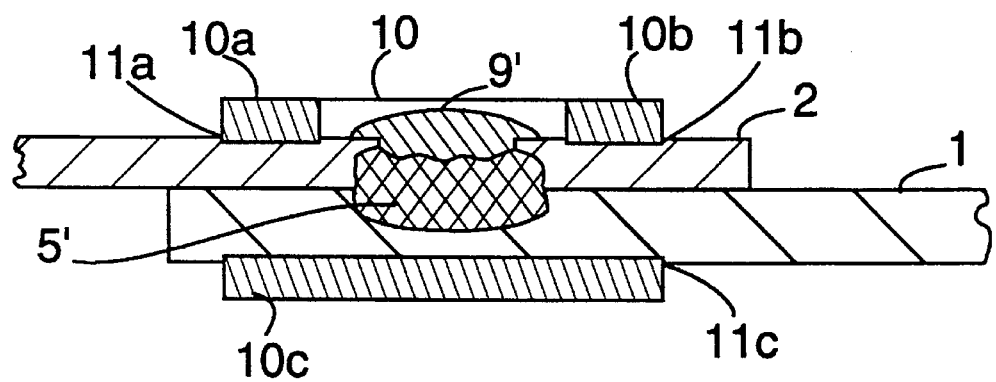
FIG. 9 is a sectional view similar to that of FIG. 6, but additionally showing a mechanical clip holding together the metallic tab and the semiconductor element.

In accordance with the present invention, if an electrical heater having a welded bond described herein is to be used in an application requiring additional mechanical strength in the S or T direction, or both, a mechanical clip can be attached to the heater to provide increased mechanical strength. FIG. 9 shows the arrangement of components of FIG. 6 with the addition of mechanical clip 10. It should be understood that the components of FIG. 8 can also be used with a clip as shown in FIG. 9.

Clip 10 as shown in FIG. 9 includes two upper shanks 10a and 10b, which press on the top of tab 2, and one lower shank 10c, which presses on the bottom of element 1. The upper shanks 10a and 10b are spaced apart and positioned to the respective sides of the protective cap 9' of the welded bond. If viewed from the side, the upper shanks 10a, 10b together with lower shank 10c, joined by a back spine (not visible in FIG. 9) form an essentially C-shaped clip.

Shanks 10a, 10b may be received in grooves 11a, 11b respectively, in the top of metallic tab 2. Shank 10c may be received in groove 11c in the bottom of element 1. Grooves 11a and 11b can be pre-formed in metallic tab 2 and groove 11c can be pre-formed in the semiconductor element 1 by various known processes. Shanks 10a and 10b pressing toward shank 10c provide a resistance to mechanical tension in direction T shown in FIGS. 6 and 8. Shanks 10a, 10b and 10c fitting into respective grooves 11a, 11b and 11c provide a resistance to mechanical shear in direction S shown in FIGS. 6 and 8. One skilled in the art will appreciate that other configurations, types or arrangements of clips can be used instead of the specific example described herein. The mechanical clip provides additional mechanical strength beyond that achieved in the embodiments described with reference to FIGS. 6 and 8.

The above-described embodiments illustrate but do not limit the present invention. One skilled in the art will appreciate that the invention can also be practiced by embodiments other than those described. While the invention has been described with particular reference to forming a semiconductor heater, for example, for use in an electrical smoking article, the invention can also be practiced in a variety of other electrical articles that include a semiconductor element ohmically bonded to a metallic element. The scope of the invention is defined and limited only by the following claims.

What is claimed is:

1. A method of establishing an ohmic mechanical joint between a metallic element and a semiconductor element comprising the steps of:

superposing at least a portion of a metallic element with at least a portion of a semiconductor element;

directing a controlled amount of heat at said superposed portion of said semiconductor element through a hole in said superposed portion of said metallic element so as to cause an amount of semiconductor material to melt and flow into the hole and react with metallic material of said metallic element to form reacted materials, said melting, flowing and reacting steps including the step of at least partially filling said hole with said reacted materials; and allowing the reacted materials to solidify in the hole to provide a joint having a substantially ohmic electrical resistance between the metallic element and the semiconductor element.

2. The method of claim 1, wherein the step of directing a controlled amount of heat comprises directing a laser beam at the semiconductor element through the hole in the metallic element.

3. The method of claim 2, wherein the step of directing a laser beam at the semiconductor element comprises pulsing a Nd:YAG laser directed at the semiconductor element.

4. The method of claim 2, wherein a plurality of laser beam pulses are directed at the semiconductor element through the hole in the metallic element.

5. The method of claim 2, wherein the laser beam is directed substantially perpendicularly to a surface of the semiconductor element.

6. The method of claim 2, wherein the laser beam is directed at an angle other than substantially perpendicular to a surface of the semiconductor element.

7. The method of claim 2, wherein the laser beam is directed to at least partially impinge on the metallic material around the sides of the hole.

8. The method of claim 1, wherein the step of directing a controlled amount of heat comprises applying a microflame to the semiconductor element through the hole in the metallic element.

9. The method of claim 8, further comprising a step of providing an inert gas at the area of adjacent of the semiconductor element and the metallic element.

10. The method of claim 9 wherein the inert gas is selected from the group consisting of argon gas and nitrogen gas.

11. The method of claim 1 further comprising a step of forming the hole in the metallic element.

12. The method of claim 11, wherein the step of forming the hole comprises directing a laser beam at the metallic element.

13. The method of claim 12, wherein the step of forming the hole in the metallic element and step of directing a controlled amount of heat comprise applying a single laser beam.

14. The method of claim 1 further comprising a step of cleaning at least selected surface of one of the elements before said superposing step.

15. The method of claim 14, wherein the surface cleaning step comprises wet chemical etching.

16. The method of claim 14, wherein the surface cleaning step comprises mechanical cleaning.

17. The method of claim 1, wherein the superposing step includes holding the metallic element and the semiconductor element in intimate surface contact during at least said heat directing step and said step allowing reacted materials to solidify.

18. The method of claim 1, further comprising a step of preheating the semiconductor element and the metallic element before the step of directing a controlled amount of heat.

19. The method of claim 18, further comprising a step of providing an inert gas at the area of adjacent of the semiconductor element and the metallic element.

20. The method of claim 19 wherein the inert gas is selected from the group consisting of argon gas and nitrogen gas.

21. The method of claim 1 further comprising a step of applying an oxidation-resistant material over an exposed surface of the reacted materials.

22. The method of claim 21 wherein the step of applying an oxidation-resistant material comprises bonding the oxidation-resistant material to the exposed surface of the reacted materials.

23. The method of claim 21, wherein the step of applying an oxidation-resistant material comprises melting an oxidation-resistant metal.

24. The method of claim 23, wherein the step of melting an oxidation-resistant metal comprises melting nickel.

25. The method of claim 23, wherein the step of melting an oxidation-resistant metal comprises directing a laser beam at the oxidation-resistant metal.

26. The method of claim 1, wherein said metallic element is constructed from copper.

27. The method of claim 26, wherein said metallic element is constructed from an alloy of copper and a transition metal element that is resistant to oxidation and that forms compounds with the semiconductor material.

28. The method of claim 27, wherein said transition metal is selected from the group consisting of nickel, chromium, titanium and molybdenum.

29. The method of claim 1, wherein said metallic element is constructed from a copper-phosphor bronze alloy.

30. The method of claim 1, wherein said semiconductor element is constructed from silicon doped with dopant impurities to provide a predetermined electrical resistivity and wherein said metallic element is constructed from a metal that is reactive with the silicon to form a metal silicide compound.

31. The method of claim 2, wherein said semiconductor element is operatable as a resistive heater element and said metallic element is operable as an electrical lead to a power supply.

32. The method of claim 31, wherein said semiconductor element is constructed from silicon doped with dopant impurities and said metallic element is constructed from a copper alloy.

33. The method of claim 1 further comprising the step of:
applying a clip operative upon the metallic element and the semiconductor element so as to press said superposed portions together.

34. The method of claim 33, wherein said semiconductor element is operable as a resistive heater element and said metallic element is operable as an electrical lead to a power supply.

35. The method of claim 34, wherein said semiconductor element is constructed from silicon doped with dopant inpurities and said metallic element is constructed from a copper alloy.

36. The method of claim 1, wherein said semiconductor element has a thickness in the range from about 0.1 mm to about 0.5 mm.

37. The method of claim 1, wherein said metallic element comprises a foil having a thickness less than about 0.4 mm.

38. The method of claim 37, wherein said foil metallic element has a thickness less than about 0.25 mm.

39. The method of claim 38, wherein said foil metallic element has a thickness in the range from about 0.08 mm to about 0.2 mm.

40. The method of claim 39, wherein said foil metallic element has a thickness in the range from about 0.15 mm to about 0.2 mm.

41. The method of claim 1, wherein said metallic element hole has a diameter in the range from about 0.1 mm to about 0.8 mm.

42. The method of claim 1, wherein said heat directing step includes directing heat through a conic frustum-shaped hole therethrough.

43. The method of claim 1, wherein said heat directing step includes causing an amount of metallic material to melt.

44. The method of claim 43, wherein causing an amount of metallic material to melt comprises contacting the metallic material with molten semiconductor material.

45. The method of claim 43, wherein said step of causing an amount of metallic material to melt comprises directing a laser beam to at least partially impinge on the metallic material adjacent the hole.

46. The method of claim 1, wherein all steps are carried out in a total time of less than about 3 seconds.

47. The method of claim 46, wherein all steps are carried out in a total time of less than about 1 second.

48. The method of claim 47, wherein all steps are carried out in a total time of less than about 0.5 seconds.

49. The method of claim 1, wherein steps (c) and (d) are carried out in a total time between about 20 msec and about 50 msec.

50. The method of claim 1 further comprising the step of providing a metallic element and a semiconductor element separate from each other prior to said superposing step.

51. The method of claim 21 further comprising the step of providing a metallic element and a semiconductor element separate from each other prior to said superposing step.

* * * * *